(12) United States Patent
Boulenc et al.

(10) Patent No.: US 11,699,720 B2
(45) Date of Patent: Jul. 11, 2023

(54) IMAGE SENSOR FOR TIME DELAY AND INTEGRATION IMAGING AND A METHOD FOR IMAGING USING AN ARRAY OF PHOTO-SENSITIVE ELEMENTS

(71) Applicant: IMEC VZW, Leuven (BE)

(72) Inventors: Pierre Boulenc, Woluwe Saint Lambert (BE); Jiwon Lee, Leuven (BE)

(73) Assignee: IMEC VZW, Leuven (BE)

( * ) Notice: Subject to any disclaimer, the term of this patent is extended or adjusted under 35 U.S.C. 154(b) by 159 days.

(21) Appl. No.: 17/400,247

(22) Filed: Aug. 12, 2021

(65) Prior Publication Data

US 2022/0059604 A1 Feb. 24, 2022

(30) Foreign Application Priority Data

Aug. 19, 2020 (EP) ..................................... 20191648

(51) Int. Cl.
*H01L 27/148* (2006.01)
*H01L 27/146* (2006.01)

(52) U.S. Cl.
CPC ...... *H01L 27/14856* (2013.01); *H01L 27/148* (2013.01); *H01L 27/14603* (2013.01); *H01L 27/14806* (2013.01)

(58) Field of Classification Search
CPC ......... H01L 27/14856; H01L 27/14806; H01L 27/14603; H01L 27/148
See application file for complete search history.

(56) References Cited

U.S. PATENT DOCUMENTS

| 4,692,993 A | 9/1987 | Clark et al. |
| 5,932,006 A | 8/1999 | Santiago et al. |

(Continued)

FOREIGN PATENT DOCUMENTS

| EP | 3107281 A1 | 12/2016 |
| EP | 3833015 A1 | 9/2021 |
| JP | 2018006874 A | 1/2018 |

OTHER PUBLICATIONS

Extended European Search Report and Written Opinion, Application No. EP20191648.3, dated Jan. 26, 2021, 5 pages.

(Continued)

*Primary Examiner* — David Vu
*Assistant Examiner* — Brandon C Fox
(74) *Attorney, Agent, or Firm* — McDonnell Boehnen, Hulbert & Berghoff LLP (57) ABSTRACT

Example embodiments relate to image sensors for time delay and integration imaging and methods for imaging using an array of photo-sensitive elements. One example image sensor for time delay and integration imaging includes an array of photo-sensitive elements that includes a plurality of photo-sensitive elements arranged in rows and columns of the array. Each photo-sensitive element includes an active layer configured to generate charges in response to incident light on the active layer. Each photo-sensitive element also includes a charge transport layer. Further, each photo-sensitive element includes at least a first and a second gate, each separated by a dielectric material from the charge transport layer. The array of photo-sensitive elements is configured such that the second gate of a first photo-sensitive element and the first gate of a second photo-sensitive element in a direction along a column of the array are configured to control transfer of charges.

20 Claims, 4 Drawing Sheets

(56) References Cited

U.S. PATENT DOCUMENTS

| | | | |
|---|---|---|---|
| 2008/0030607 A1* | 2/2008 | Ikeda | H04N 25/713 |
| | | | 348/311 |
| 2010/0177224 A1 | 7/2010 | Vampola et al. | |
| 2017/0221960 A1* | 8/2017 | Lin | H10K 59/60 |
| 2020/0303446 A1 | 9/2020 | Moriwaki | |

OTHER PUBLICATIONS

Buss, D. D., R. A. Chapman, M. A. Kinch, S. R. Borrello, A. Simmons, and C. G. Roberts. "Infrared monolithic HgCdTeIR CCD focal plane technology." In 1978 International Electron Devices Meeting, pp. 496-500. IEEE, 1978.

Deyhimy, I., J. S. Harris, R. C. Eden, D. D. Edwall, S. J. Anderson, and L. O. Bubulac. "GaAs charge-coupled devices." Applied Physics Letters 32, No. 6 (1978): 383-385.

\* cited by examiner

IMAGE SENSOR FOR TIME DELAY AND INTEGRATION IMAGING AND A METHOD FOR IMAGING USING AN ARRAY OF PHOTO-SENSITIVE ELEMENTS

CROSS-REFERENCE TO RELATED APPLICATIONS

The present application is a non-provisional patent application claiming priority to European Patent Application No. EP 20191648.3, filed Aug. 19, 2020, the contents of which are hereby incorporated by reference.

FIELD OF THE DISCLOSURE

The present disclosure relates to an image sensor for time delay and integration imaging and a method for imaging. In particular, the present disclosure relates to imaging using an array of photo-sensitive elements which may be formed by thin-film technology.

BACKGROUND

Using silicon in light detection sets limits to the wavelengths that may be detected, based on optical characteristics of silicon. Therefore, it is of interest to use other materials in light detection. In this regard, photo-sensitive devices that may be formed using thin-film technology is interesting, since such photo-sensitive devices could be monolithically integrated on semiconductor substrates to still make use of the semiconductor substrate to provide circuitry for read-out and processing of signals from the photo-sensitive devices. This would facilitate e.g. infra-red imaging.

In time delay and integration (TDI) imaging, it may be beneficial to use a charge-coupled device (CCD) for imaging, since it allows accumulation and transfer of charges between photo-sensitive elements such that a single read-out of the accumulated charges may be performed allowing a TDI image to be acquired with high signal-to-noise ratio. However, charges are transferred in a CCD within the semiconductor substrate, such that TDI imaging using CCDs would be limited to wavelengths suitable to be detected by silicon, i.e. visible wavelengths. TDI imaging using an image sensor based on complementary metal-oxide-semiconductor (CMOS) technology that may be implemented e.g. in thin-film technology suffers from a low signal-to-noise ratio because accumulation of the signal is performed using digital or voltage domain summation.

SUMMARY

Example embodiments provide an image sensor which may be used for time delay and integration imaging providing good signal-to-noise characteristics. In particular, example embodiments provide a technology for enabling TDI imaging with good signal-to-noise characteristics in various ranges of light wavelengths, such as in an ultraviolet or an infra-red range.

These and other features are at least partly met by the embodiments as defined in the independent claims. Other embodiments are set out in the dependent claims.

According to a first aspect, there is provided an image sensor, the image sensor comprising: an array of photo-sensitive elements comprising a plurality of photo-sensitive elements arranged in rows and columns of the array, wherein each photo-sensitive element comprises: an active layer configured to generate charges in response to incident light on the active layer; a charge transport layer formed of a semiconductor, wherein the charge transport layer comprises a first portion and a second portion, wherein the second portion is laterally displaced in a direction along a column of the array in relation to the first portion; and at least a first and a second gate, each separated by a dielectric material from the charge transport layer, wherein the charge transport layer is arranged between the active layer and the first and the second gate, wherein the first gate is configured to control a potential of the first portion of the charge transport layer and the second gate is configured to control a potential of the second portion of the charge transport layer and wherein the first and the second gates are configured for controlling movement of charges from the first portion of the charge transport layer to the second portion of the charge transport layer; wherein the array of photo-sensitive elements is configured such that the second gate of a first photo-sensitive element and the first gate of a second photo-sensitive element adjacent to the first photo-sensitive element in a direction along a column of the array are configured to control transfer of charges from the second portion of the charge transport layer of the first photo-sensitive element to the first portion of the charge transport layer of the second photo-sensitive element.

According to example embodiments, an active layer is configured to generate charges in response to incident light. The use of an active layer allows the layer to be separate from a substrate of the image sensor, such that the active layer may be formed by a material providing suitable optical characteristics for the desired light detection. For instance, the active layer may allow detection of ultraviolet light, visible light and/or infra-red light.

The image sensor may comprise a semiconductor substrate, in which an integrated circuit may be formed for processing signals acquired by the array of photo-sensitive elements. However, the image sensor need not at all comprise a semiconductor substrate. Further, the charge transport layer and the active layer may be suitable for being formed by thin-film technology, which may be applied on any type of carrier substrate.

Each of the photo-sensitive elements of the image sensor according to example embodiments comprises at least a first and a second gate, configured to control a potential of a first and a second portion of the charge transport layer. This implies that the photo-sensitive elements are configured such that movement of charges between different portions of the charge transport layer may be achieved.

In some examples, each of the photo-sensitive elements may comprise a plurality of gates which in combination may define a plurality of portions of the charge transport layer between which charges may be moved. In some embodiments, each of the gates may be associated with a corresponding portion in the charge transport layer, but alternatively, two or more gates may be associated with a single portion in the charge transport layer such that voltages provided to the two or more gates could in combination define the potential of the associated portion of the charge transport layer. Further, the portions of the charge transport layer may be separate or may be partly overlapping in the charge transport layer.

Further, the gates of adjacent photo-sensitive elements may be controlled such that charges may be transferred from a portion of the charge transport layer corresponding to one photo-sensitive element to a portion of the charge transport layer corresponding to another photo-sensitive elements. Hence, charges may be transferred laterally within the charge transport layer between photo-sensitive elements.

This may be used for transferring charges from within the array of photo-sensitive elements to ends of columns, such that read-out of signals may occur peripherally to the array of photo-sensitive elements.

For instance, this allows charges accumulated in different photo-sensitive elements to be added to each other for TDI imaging. A signal corresponding to an amount of accumulated charges may be read out at an end of a column of the array, which implies that the signal may be acquired with a very good signal-to-noise ratio, since only read-out noise for one read-out operation is added to the acquired signal.

The gates of the photo-sensitive elements may modulate potentials of portions in the charge transport layer. By changing the potential of different portions in the charge transport layer, charges may be moved within the charge transport layer. In this respect, each photo-sensitive element may comprise a plurality of gates for defining plural portions of the charge transport layer between which charges may be moved. Further, the gates may be used for ensuring isolation between adjacent photo-sensitive elements (during time periods when no charge transfer between the photo-sensitive elements is to be performed). For instance, opposite voltages may be used at neighboring gates of the adjacent photo-sensitive elements in order to isolate between the photo-sensitive elements.

The active layer may be configured to absorb incident light to generate charges. Thus, an amount of charges generated is indicative of an amount of incident light on the active layer. The generated charges may be transported through the active layer to the charge transport layer.

Modulation of potentials of the charge transport layer may also be used for ensuring that charges in the charge transport layer represent amount of incident light with good signal-to-noise characteristics, such as limiting reset noise and dark current.

The active layer may be sandwiched between charge transport layers for collecting holes and electrons, respectively. One of the charge transport layers may be used for accumulating and transfer of charges for read-out of signals from the photo-sensitive elements. This charge transport used for read-out of signals may be a hole transport layer or an electron transport layer.

The charge transport layer and the active layer may be arranged in separate, parallel planes. The image sensor may be oriented such that the charge transport layer is above the gates and, in such case, the active layer is above the charge transport layer.

In various embodiments, a layer defined as being arranged "above"/"on" or "below" another layer, need not be arranged directly on top of or directly below the other layer. Rather, there may be other intermediate layers in-between.

According to an embodiment, the first gate of the photo-sensitive elements is provided by a first metal line extending in a direction along a row of the array such that the first metal line is shared by photo-sensitive elements in the row of the array, and wherein the second gate of the photo-sensitive elements is provided by a second metal line extending in a direction along a row of the array such that the second metal line is shared by photo-sensitive elements in the row of the array.

Thus, the first metal line and the second metal line could be used for controlling all photo-sensitive elements within a row of the array. This implies that the image sensor may be efficiently controlled using a small number of metal lines for controlling the photo-sensitive elements. Further, this implies that the movement of charges within photo-sensitive elements of a row of the array may be easily synchronized as the photo-sensitive elements are being controlled by common metal lines.

According to an embodiment, the first metal line and the second metal line are arranged in a back metal gate layer of the image sensor and wherein the image sensor further comprises a spacer dielectric line extending in a direction along a row of the array between the first metal line and the second metal line.

Hence, the image sensor may comprise a layer in which metal lines are provided for controlling the photo-sensitive elements. The back metal gate layer may be arranged in a separate plane parallel to the charge transport layer and the active layer.

The space dielectric line may isolate the first metal line from the second metal line to ensure that signals in the respective lines are isolated. The back metal gate layer may comprise a large plurality of parallel metal lines, wherein pairs of adjacent metal lines are isolated by a spacer dielectric line in-between.

According to an embodiment, the charge transport layer comprises a plurality of charge transport stripes, wherein each charge transport stripe is configured to extend in a direction along a column of the array.

Thus, the charge transport layer may be continuous along a column of the array for enabling transfer of charges within the charge transport stripe between photo-sensitive elements of the column of the array.

According to an embodiment, the image sensor further comprises a spacer dielectric stripe in the charge transport layer, wherein the spacer dielectric stripe is configured to extend in a direction along a column of the array to separate two adjacent charge transport stripes.

The spacer dielectric stripe may isolate two adjacent charge transport stripes from each other, so as to avoid cross-talk between photo-sensitive elements in adjacent columns.

According to an embodiment, at least the first gate is configured to provide a voltage for fully depleting the first portion of the charge transport layer.

Generated charges are moved laterally in the charge transport layer and read-out need not be made in circuitry below the photo-sensitive elements. This implies that it is possible to achieve full depletion of the charge transport layer before charges are transferred to the charge transport layer based on incident light being absorbed in the active layer.

Full depletion is beneficial in providing good noise characteristics of the image sensor, since reset noise may be limited, a dark current may be limited and a high conversion gain may be provided.

According to an embodiment, the active layer comprises a quantum dot, an organic photodetector material or a perovskite material.

These materials may allow detection of light in different wavelength intervals. Thus, the photo-sensitive device may for instance be used for detecting infrared light, which may not be possible if silicon is used for light detection.

Use of quantum dot, organic photodetector material and perovskite materials may be well suited to the configuration of the photo-sensitive device. However, it may also be possible to use other materials.

According to an embodiment, the charge transport layer is formed by a metal-oxide semiconductor, such as indium-gallium-zinc oxide, IGZO, titanium oxide, or zinc oxide.

Use of a metal-oxide semiconductor may allow the charge transport layer to be formed by a suitable material for transfer of charges in the image sensor. Various alternatives exist, such as indium-gallium-zinc oxide (IGZO), titanium oxide, zinc oxide, indium-tin-zinc-oxide, or hafnium-indium-zinc-oxide using an n-type semiconductor. Other alternatives are tin-oxide, copper-oxide, selenides, and sulfides using a p-type semiconductor.

According to an embodiment, each photo-sensitive element comprises a stack comprising, from bottom to top of the stack, a gate metal, a dielectric, the charge transport layer, and the active layer, and wherein light is incident on the photo-sensitive element from the top of the stack.

Thus, functionality of the photo-sensitive elements may be provided by a stacked configuration. This implies that the photo-sensitive elements may be suitable for being formed by thin-film technology. The arrangement of the active layer in the stack of the photo-sensitive element may de-couple sensing of the incident light from a substrate, such that the active layer may be chosen to fit desired optical characteristics of the photo-sensitive elements.

In some examples, the stack may comprise further layers and/or structures above, below and/or in-between the above-discussed components of the stack.

According to an embodiment, the charge transport layer is an electron transport layer and wherein the stack further comprises a hole transport layer on top of the active layer.

Thus, active layer may be sandwiched between transport layers. Charges generated in the active layer may be respectively transported to the electron transport layer and hole transport layer, respectively. Thus, holes and electrons may be separated and with a single carrier type in the charge transport layer good control of further transfer of charges within the charge transport layer is enabled.

According to another embodiment, the charge transport layer is a hole transport layer and wherein the stack further comprises an electron transport layer on top of the active layer.

Thus, although the image sensor may be mainly described herein with an electron transport layer being used as the charge transport layer for transferring charges to be read-out from the image sensor, in some examples the charge transport layer may alternatively be a hole transport layer.

In addition, according to an embodiment, the stack may further comprise an electrode on top of an upper charge transport layer (e.g. a hole transport layer) that is arranged on top of the active layer.

The electrode may be used for controlling a potential of the upper charge transport layer, which may be used to ensure good transport of charges from the active layer to the upper charge transport layer. The electrode may be formed by a material transparent to the wavelength of light to be detected by the image sensor. For example, in some embodiments, the electrode may be formed by indium tin oxide.

According to an embodiment, the image sensor further comprises a floating diffusion node connected to the charge transport layer at an end of a column of the array.

Hence, charges may be accumulated through the column of the array and transferred to the floating diffusion node. Then, a signal corresponding to the amount of charges in the floating diffusion node may be read out to provide a low-noise signal representing incident light on the photo-sensitive elements of the column.

According to an embodiment, the charge transport layer is connected to a floating diffusion node of a read-out integrated circuit for read-out of image information from the array of photo-sensitive elements.

The read-out integrated circuit may be formed by semiconductor technology, such as using complementary metal-oxide-semiconductor (CMOS) circuitry. Thus, the image sensor may make use of existing technology for manufacturing of small-scale circuitry, e.g. for processing the image information acquired by the array of photo-sensitive elements.

The active layer and charge transport layer may be formed on a silicon CMOS wafer, on which a read-out integrated circuit is formed. However, the active layer and charge transport layer may alternatively be formed on other substrates, such as a thin-film technology wafer, which may for example use organic materials.

In some embodiments, the active layer and the charge transport layer may be arranged in different relations to the read-out integrated circuit. For instance, the active layer and the charge transport layer may be arranged on top of the read-out integrated circuit on the substrate. However, in another embodiment, the active layer and the charge transport layer may be arranged on a common substrate with the read-out integrated circuit, but the active layer and the charge transport layer of the photo-sensitive device may be arranged next to the read-out integrated circuit on the substrate. For instance, the active layer and the charge transport layer of the photo-sensitive device and the read-out integrated circuit may be arranged on the same polyimide substrate. In such case, the read-out integrated circuit may be designed by using thin-film technology.

According to an embodiment, the array of photo-sensitive elements is configured to accumulate charges generated in response to incident light at photo-sensitive elements in a column of the array and synchronize transfer of the accumulated charges along the column of the array with movement of an object to be imaged in relation to the image sensor for time delay and integration imaging.

By synchronizing the transfer of accumulated charges with movement of the object in relation to the image sensor, the accumulated charges from several photo-sensitive elements will relate to the same portion of the object so as to allow sensing of high light levels for TDI imaging.

A control unit may know a speed of movement of the object in relation to the image sensor and may be configured to clock transfer of charges between photo-sensitive elements of the array to be synchronized with the movement of the object in relation to the image sensor.

In some examples, one of the object or the image sensor may move and the other of the object or the image sensor may be fixed. Thus, for instance, the image sensor may move in relation to the object, e.g. by the image sensor being arranged in an airplane and configured to image the ground below the airplane. Alternatively, the object may move in relation to the image sensor, e.g. by the object being carried by a conveyor belt and the image sensor being arranged to image the object as it is transported by the conveyor belt past the image sensor.

According to a second aspect, there is provided a method for imaging using an array of photo-sensitive elements comprising a plurality of photo-sensitive elements arranged in rows and columns of the array, the method comprising: generating charges in an active layer in response to incident light on the active layer; accumulating charges, based on the generated charges, in a first portion of a charge transport layer of a first photo-sensitive element; moving accumulated charges from the first portion of the charge transport layer to a second portion of a charge transport layer of the first photo-sensitive element under control of a first and a second gate, each separated by a dielectric material from the charge transport layer, wherein the first gate is configured to control a potential of the first portion of the charge transport layer and the second gate is configured to control a potential of the second portion of the charge transport layer; and transferring the accumulated charges from the second portion of the charge transport layer of the first photo-sensitive element to a first portion of the charge transport layer of a second photo-sensitive element adjacent to the first photo-sensitive element in a direction along a column of the array.

Effects and features of this second aspect are largely analogous to those described above in connection with the first aspect. Embodiments mentioned in relation to the first aspect are largely compatible with the second aspect.

Thus, charges accumulated based on incident light may be moved laterally in the charge transport layer to allow charges to be transferred between photo-sensitive elements in a column of the array. This may allow charges to be moved out of the array of photo-sensitive elements such that read-out may be performed peripherally to the array.

Further, use of an active layer for generating charges in response to incident light allows the layer to be separate from a substrate of the image sensor, such that the active layer may be formed by a material providing suitable optical characteristics for the desired light detection. For instance, the active layer may allow detection of ultraviolet light, visible light and/or infra-red light.

According to an embodiment, the method further comprises synchronizing transfer of the accumulated charges with movement of an object to be imaged in relation to the image sensor and wherein charges accumulated based on the generated charges in the second photo-sensitive element are added to the accumulated charges transferred from the first photo-sensitive element to the first portion of the second photo-sensitive element.

This implies that TDI imaging may be performed, allowing the signal accumulated over a column of the array to be read-out at the end of the array such that a good signal-to-noise ratio may be obtained.

BRIEF DESCRIPTION OF THE DRAWINGS

The above, as well as additional features, will be better understood through the following illustrative and non-limiting detailed description, with reference to the appended drawings. In the drawings like reference numerals will be used for like elements unless stated otherwise.

DETAILED DESCRIPTION

Figure 1:
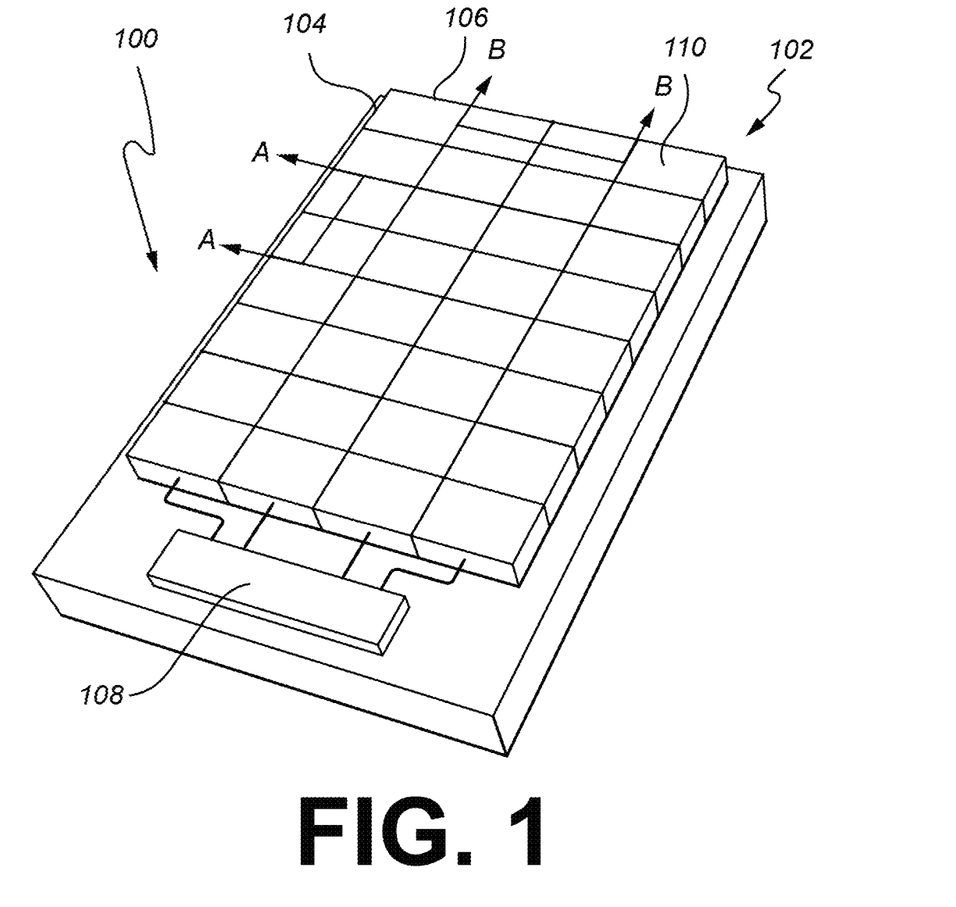
FIG. 1 is a schematic view of an image sensor, according to example embodiments.

FIG. 1 illustrates an image sensor 100 comprising an array 102 of photo-sensitive elements 110 arranged in rows 104 and columns 106 of the array. The array 102 may enable detection of a plurality of signals representing incident light on respective photo-sensitive elements 110 in the array 100. This may for instance be used for acquiring a spatially and/or spectrally resolved image. In particular, the array 102 may be configured to accumulate signals generated in photo-sensitive elements 110 of a column 106 for time delay and integration (TDI) imaging.

The image sensor 100 may further comprise read-out circuitry 108. The read-out circuitry 108 may be configured to read-out image information at the end of the columns 106 of the array 102. Thus, the read-out circuitry 108 may be re-used for all photo-sensitive elements 110 within one column 106 of the array 102.

The read-out integrated circuit 108 may be used for reading out signals of detected amount of light, and may also be used for analog-to-digital conversion of the read out signals and/or for more advanced processing of the signals.

Whilst the photo-sensitive elements 110 may comprise a layer structure de-coupling an active part for absorbing incident light from a substrate of the image sensor, the read-out circuitry 108 may be formed as an integrated circuit which may be formed by semiconductor technology, such as using complementary metal-oxide-semiconductor (CMOS) circuitry. Thus, the image sensor 100 may make use of existing technology for manufacturing of small-scale circuitry.

The photo-sensitive elements 110 may be integrated with a substrate on which read-out integrated circuit 108 is provided. This ensures that the image sensor 100 with read-out circuitry 108 may be very compact and allows processing of detected signals in a small-scale device.

The photo-sensitive elements 110 may be integrated on a silicon CMOS wafer, on which the read-out integrated circuit 108 is formed. However, the photo-sensitive elements 110 may alternatively be formed on other substrates, such as a thin-film technology wafer, which may, for example, use organic materials and on which the read-out integrated circuit 108 may be formed.

In various embodiments, the layer structure of the photo-sensitive elements 110 may be arranged in various, alternate and/or different relations to a read-out integrated circuit. For instance, the layer structure may be arranged on top of the read-out integrated circuit 108 on the substrate. However, in another embodiment, the layer structure may be arranged on a common substrate with the read-out integrated circuit 108, but the layer structure of the photo-sensitive elements 110 may be arranged next to the read-out integrated circuit 108 on the substrate, e.g. in a common plane. For instance, the layer structure of the photo-sensitive elements 110 and the read-out integrated circuit 108 may be arranged on the same polyimide substrate. In such case, the read-out integrated circuit 108 may be designed by using thin-film technology.

In example embodiments, ends of columns 106 of the array 102 may in another alternative be connected to a wire for transferring signals from the ends of columns 106. The wire may be connected to a separate substrate, such that the read-out integrated circuit 108 need not even be provided on the same substrate as the photo-sensitive elements 110.

Figure 2:
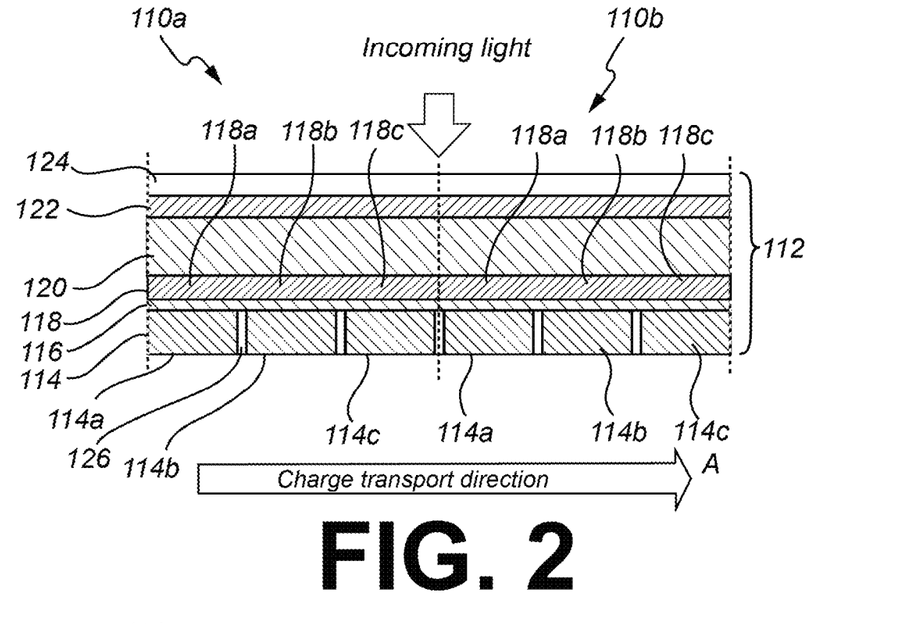
FIG. 2 is a schematic cross-sectional view of the image sensor along a part of a column of an array of photo-sensitive elements, according to example embodiments.

FIG. 2 illustrates a cross-section along lines A-A in FIG. 1, forming a cross-section of the image sensor 100 along a part of a column 106 of the array 102, showing two photo-sensitive elements 110a, 110b.

Each of the photo-sensitive elements 110 comprise a layer structure 112 forming a stack for detecting incident light and converting incident light to a signal corresponding to the amount of incident light.

The layer structure 112 of the photo-sensitive element 110 may be suitable for being formed by thin-film layer deposition. This may ensure that the photo-sensitive element 110 may be very compact and small-size and may also facilitate use of the photo-sensitive element 110 in combination with the read-out integrated circuit 108, which may also be formed using thin-film technology or which may be formed by semiconductor processing on a semiconductor substrate, as described above. However, the layer structure 112 need not necessarily be formed using thin-film layer deposition.

The photo-sensitive element 110 may comprise an active layer 120, which may be configured to absorb light and generate charges based on the absorbed light. Thus, electron-hole pairs may be generated by the active layer based on light being absorbed. The electron charges and hole charges may be transferred to respective charge transport layers 118, 122 on opposite sides of the active layer 120 such that the active layer 120 may be sandwiched between the charge transport layers 118, 122. Thus, generated electron charges may be transferred to an electron transport layer 118 and generated hole charges may be transferred to a hole transport layer 122.

The photo-sensitive element 110 may comprise electrodes in a back metal gate layer 114 and in a top electrode layer 124 on opposite sides of the charge transport layers 118, 122. The electrodes of the back metal gate layer and the top electrode layer 114, 124 may be configured to provide an electric field for driving charges generated in the active layer 120 towards the electron transport layer 118 and hole transport layer 122, respectively.

Thus, when light is incident on the active layer 120, charges will be generated and accumulated in the electron transport layer 118, whereas charges may be transported to the hole transport layer 122 and be drained through the electrode 124. The accumulation of charges in the electron transport layer 118 and the hole transport layer 122 prevents or at least reduces recombination of holes and electrons in the active layer 120 to ensure that a high efficiency in light detection is provided by the photo-sensitive element 110.

The active layer 120 may be sensitive to a particular, that is a specific, predetermined or selective, range of wavelengths of light. The range of wavelengths may be narrow to allow detection of a specific wavelength, but the range of wavelengths may alternatively be broad such that the photo-sensitive element 110 may be able to generally detect an amount of light over a broad range, such as covering the range of visible light and extending into the range of infrared light. In the latter case, the photo-sensitive element 110 may be combined with a filter such that the filter may select which range of wavelengths that should be detected by the photo-sensitive element 110. Also, having an active layer 120 which is sensitive to a broad range of wavelengths would allow using the same type of active layer 120 within the array 104, wherein different photo-sensitive elements 110 in the array may be associated with different filters for providing spectrally resolved imaging. Hence, spectrally resolved imaging would not require using different materials for the active layer 120 in different photo-sensitive elements 110.

In particular, the active layer 120 may be formed from a material which is sensitive to wavelengths in the infrared range. Thus, the image sensor 100 may be used for infrared detection, which may not be achieved with image sensors using silicon for light detection. Thus, the image sensor 100 may be particularly interesting to use for detection of infrared light. However, it should be understood that the image sensor 100 may also be well suited for detection of visible light by proper selection of the active layer 120.

The active layer 116 may be formed from various materials. In particular, the photo-sensitive element 110 is well suited for using an organic material in the active layer 120, such as an organic semiconductor material.

The active layer 116 may, for example, comprise a quantum dot, an organic, or a perovskite material. For example, polymers semiconductors, e.g. poly[N-9'-heptadecanyl-2,7-carbazole-alt-5,5-(4',7'-di-2-thienyl-2',1',3'-benzothiadiazole) (PCDTBT), poly(3-n-hexylthiophene) (P3HT), or ones based on bay-annulated indigo (BAI) such as when combined with thieno[3,2-b]thiophene (TT; PTTBAI) and small molecules, e.g. lead phthalocyanine (PbPc), copper-phthalocyanine (CuPc) may be used as an organic active layer. Lead sulfide (PbS), lead selenide (PbSe), indium arsenide (InAs), copper selenide (CuSe), or indium antimonide (InSb) may be used as colloidal quantum dots. Such materials may be suitable for use in manufacturing of the image sensor 100 using thin-film technology. Also, such materials may be used for selecting a sensitivity of wavelengths of light of the image sensor 100 to enable using the image sensor 100 in various applications spanning a broad range of wavelengths of light from ultraviolet light to infrared light.

However, it should be understood that the photo-sensitive element 110 is not necessarily limited to use of the particular examples of materials of the active layer 120 provided herein. Rather, other materials may also be available and used with the photo-sensitive element 110.

The light to be detected may be incident on a top electrode 124 arranged above the active layer 120 such that light encounters the top electrode 124 before reaching the active layer 120. However, it should be understood that the photo-sensitive element 110 may alternatively be configured for back-side illumination such that light to be detected may be incident on the back metal gate layer 114 below the active layer 120 such that light encounters the back metal gate layer 114 before reaching the active layer 120.

The top electrode 124 may be formed from a material that is transparent to relevant wavelengths (to be detected by the photo-sensitive element 110) to ensure that the light is passed to the active layer 120 for detection with high sensitivity. For instance, the top electrode 124 may be formed by indium tin oxide.

The electrodes of the back metal gate layer and the top electrode layer 114, 124 may be configured to control a potential of the charge transport layers 118, 122 to control function of the photo-sensitive element 110. The top electrode 124 sets a potential of the charge transport layer 122 above the active layer 120 and the electrodes of the back metal gate layer 114, which comprises a plurality of gates 114a, 114b, 114c as further described below sets a potential of portions of the charge transport layer 118 below the active layer 120.

The back metal gate layer 114 arranged below the active layer 120 and below the charge transport layer 118 may form gates 114a, 114b, 114c for controlling the potential of portions of the charge transport layer 118. The gates 114a, 114b, 114c may thus be separated from the charge transport layer 118 by a dielectric material 116.

Each of the gates 114a, 114b, 114c may e.g. be formed by a gate metal or polysilicon or a transparent material in case the photo-sensitive element 110 is used for back-side illumination. The gates 114a, 114b, 114c may be separated by a layer of a dielectric material 116, such as SiO2, from the charge transport layer 118. The structure of the back metal gate layer 114 comprising gates 114a, 114b, 114c may thus be well suited for being formed by semiconductor processing on a semiconductor substrate, which may be combined with the remaining layers of the layer structure 112 by forming these layers on top of the semiconductor substrate using thin-film layer deposition.

A first gate 114*a* may be arranged below a first portion 118*a* of the charge transport layer 118 to control a potential of the first portion 118*a*, a second gate 114*c* may be arranged below a second portion 118*c* of the charge transport layer 118 to control a potential of the second portion 118*c*, and an intermediate gate 114*b* may be arranged below an intermediate portion 118*b* of the charge transport layer 118 between the first and second portions 118*a*, 118*c* to control a potential of the intermediate portion 118*b*. The second portion 118*c* of the charge transport layer 118 of a first photo-sensitive element 110*a* may be a neighboring portion to the first portion 118*a* of the charge transparent layer 118 of a neighboring photo-sensitive element 110*b* along the column 106 of the array 102.

The potentials of the first and second portions 118*a*, 118*c* of neighboring photo-sensitive elements 110*a*, 110*b* may during accumulation of charges based on incident light in the photo-sensitive elements 110*a*, 110*b* be set to isolate the photo-sensitive elements 110*a*, 110*b* from each other in order to avoid cross-talk. For instance, the first gate 114*a* of the second photo-sensitive element 110*b* and the second gate 114*c* of the first photo-sensitive element 110*a* may be set to opposing voltages.

Controlling potentials of the first, intermediate and second portions 118*a*, 118*b*, 118*c* of the charge transport layer 118 allows defining electrostatic potential wells and barriers within the charge transport layer 118. By changing the voltages applied to the gates 114*a*, 114*b*, 114*c*, the electrostatic potential wells and barriers may be changed within the charge transport layer 118 for moving charges within the charge transport layer 118. In this regard, charges may be moved along a charge transport direction A as illustrated in FIG. 2 from the first portion 118*a* via the intermediate portion 118*b* to the second portion 118*c* of the charge transport layer 118 within a first photo-sensitive element 110*a* and may then be transferred from the second portion 118*c* of the charge transport layer 118 of the first photo-sensitive element 110*a* to the first portion 118*a* of the charge transport layer 118 of the second photo-sensitive element 110*b* which is neighboring to the first photo-sensitive element 110*a* along the column 106 of the array 102.

The gates 114*a*, 114*b*, 114*c* may be formed by metal lines extending along the rows 104 of the array 102. Thus, the metal lines may control all photo-sensitive elements 110 in a row 104 of the array 102.

The metal lines of the gates 114*a*, 114*b*, 114*c* may further be isolated from each other by spacer dielectric 126 in order to ensure that the gates 114*a*, 114*b*, 114*c* may be separately controlled to control a potential of a respective portion of the charge transport layer 118. The spacer dielectric 126 may be provided as lines extending between two neighboring metal lines of the gates 114*a*, 114*b*, 114*c*.

The gates 114*a*, 114*b*, 114*c* may be controlled to define an electrostatic potential well in a portion of the charge transport layer 118 during an integration period, in which charges generated in the active layer 120 in response to incident light are transported to the charge transport layer 118 and accumulated in the portion of the charge transport layer 118 in which the electrostatic potential well is formed. For instance, the electrostatic potential well during the integration period may be formed in the first portion 118*a* of the charge transport layer 118.

After the integration period, the voltages provided on the gates 114*a*, 114*b*, 114*c* may be clocked for moving the charges from the portion of the charge transport layer 118 in which charges were accumulated, e.g. the first portion 118*a*. The movement of charges may be performed in plural steps in order to move the charges in the charge transport layer 118 of the first photo-sensitive element 110*a* and transfer the charges to the charge transport layer 118 of the second, adjacent photo-sensitive element 110*b*.

The gates 114*a*, 114*b*, 114*c* may implement a clocking scheme corresponding to charge-coupled device (CCD) clocking schemes for moving charges within a CCD. For instance, a three-phase CCD clocking scheme may be implemented, wherein the photo-sensitive elements 110 comprise three gates 114*a*, 114*b*, 114*c* and the charges are sequentially moved from a well-defined in the first portion 118*a* of the charge transport layer 118, to a well-defined in the intermediate portion 118*b* of the charge transport layer 118, further to a well-defined in the second portion 118*c* of the charge transport layer 118 and finally to a well-defined in the first portion 118*a* of the charge transport layer 118 of the second, adjacent photo-sensitive element 110*b*.

According to an alternative, the photo-sensitive element 110 may comprise four gates. The gates may then implement a four-phase CCD clocking scheme, wherein electrostatic potential wells may be defined to extend over a portion corresponding to two adjacent gates. The electrostatic potential well thus first extends in a first portion of the charge transport layer corresponding to a first gate and a first intermediate gate adjacent to the first gate. The charges may then be moved to an electrostatic potential well extending in a portion of the charge transport layer corresponding to the first intermediate gate and a second intermediate gate adjacent to a second gate, and so forth until the charges are moved to a well-defined by the first gate and the first intermediate gate of an adjacent photo-sensitive element.

In other examples further alternative clocking schemes may be used.

The photo-sensitive element 110 may be configured to move all charges accumulated in the portion of the charge transport layer 118 in which the electrostatic potential well is formed during the integration period, e.g. the first portion 118*a*. Thus, the portion of the charge transport layer 118 may be fully depleted, which may ensure that the image sensor 100 may provide good noise characteristics.

The movement of charges accumulated in the portion of the charge transport layer 118 in order to transfer the charges from the first photo-sensitive element 110*a* to the second photo-sensitive element 110 along the column 106 of the array 102 may be synchronized with movement of an object to be imaged in relation to the image sensor 100. Thus, the portion of the charge transport layer 118 in which charges are accumulated during an integration period, e.g. the first portion 118*a*, may receive charges that have been accumulated in photo-sensitive elements 110 at previous rows 104 of the array 102. Thus, charges accumulated in the photo-sensitive element 110 may be added to previously accumulated charges in order to perform TDI imaging.

Charges may thus be accumulated along each column 106 over a plurality of rows 104 such that, when charges are read out from the column 106, the charges represent imaging of an object during a long exposure period corresponding to a sum of the integration periods of all the photo-sensitive elements 110 in the plurality of rows 104.

Figure 3:
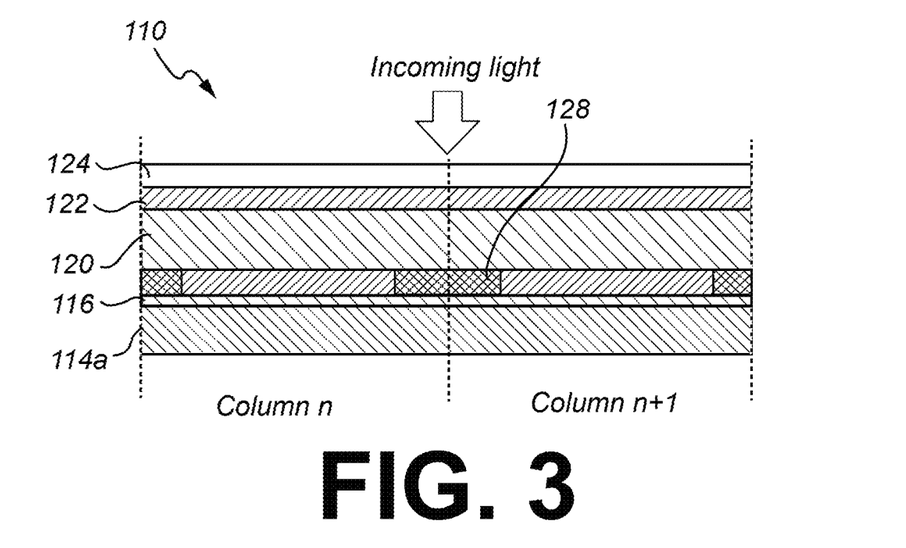
FIG. 3 is a schematic cross-sectional view of the image sensor along a part of a row of the array of photo-sensitive elements, according to example embodiments.

FIG. 3 illustrates a cross-section along lines B-B in FIG. 1, forming a cross-section of the image sensor 100 along a part of a row 104 of the array 102, showing two photo-sensitive elements 110.

As illustrated in FIG. 3, a metal line of a gate 114a may extend along the row 104 of the array so as to control all photo-sensitive elements 110 in a row 104 of the array 102.

As further illustrated in FIG. 3, a spacer dielectric 128 may be provided between parts of the charge transport layer 118 associated with different columns 106 of the array 102. Hence, the image sensor 100 may comprise a plurality of charge transport stripes, each extending along a respective column 106 of the array 102 and spacer dielectric stripes, each extending along a direction of columns 106 of the array 102 and separating two adjacent charge transport stripes.

According to an embodiment, the charge transport layer 118 arranged below the active layer 120 is an electron transport layer 118.

The electron transport layer 118 may be formed by a n-type metal-oxide semiconductor. Various alternatives exist, such as indium-gallium-zinc oxide (IGZO), e.g. amorphous IGZO, titanium oxide, zinc oxide, indium-tin-zinc-oxide, or hafnium-indium-zinc-oxide.

In such embodiment, the charge transport layer 122 arranged above the active layer 120 may be a hole transport layer 122.

According to another embodiment, the charge transport layer 118 arranged below the active layer 120 is a hole transport layer 118.

The hole transport layer 118 may be formed by a p-type metal-oxide semiconductor. Various alternatives exist, such as poly(3,4-ethylenedioxythiophene) polystyrene sulfonate (PEDOT:PSS), molybdenum oxide, nickel oxide, poly(N, N'-bis(4-butylphenyl)-N,N'-bis(phenyl)-benzidine) (poly-TPD), tin-oxide, copper-oxide, selenides, and sulfides.

In such embodiment, the charge transport layer 122 arranged above the active layer 120 may be an electron transport layer 122.

Figure 4:
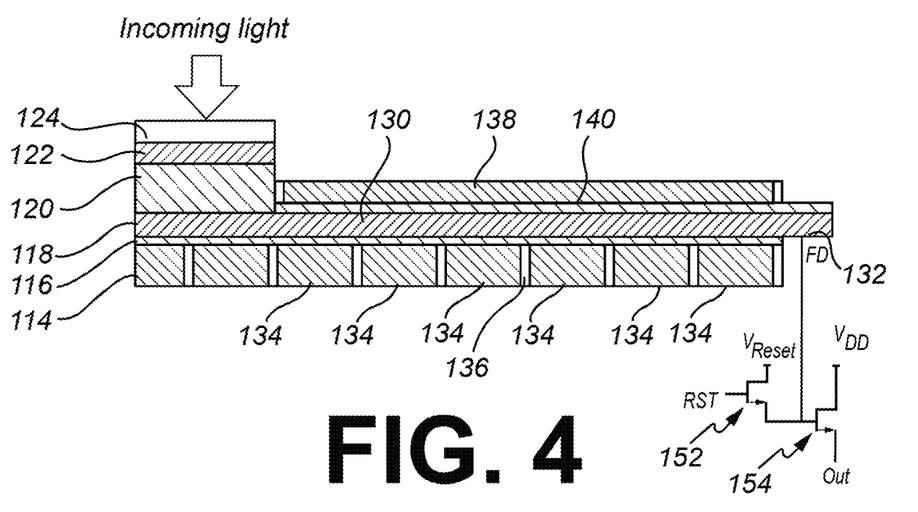
FIG. 4 is a schematic cross-sectional view along a column of the array for read-out of image information at an end of the column, according to example embodiments.
Figure 5:
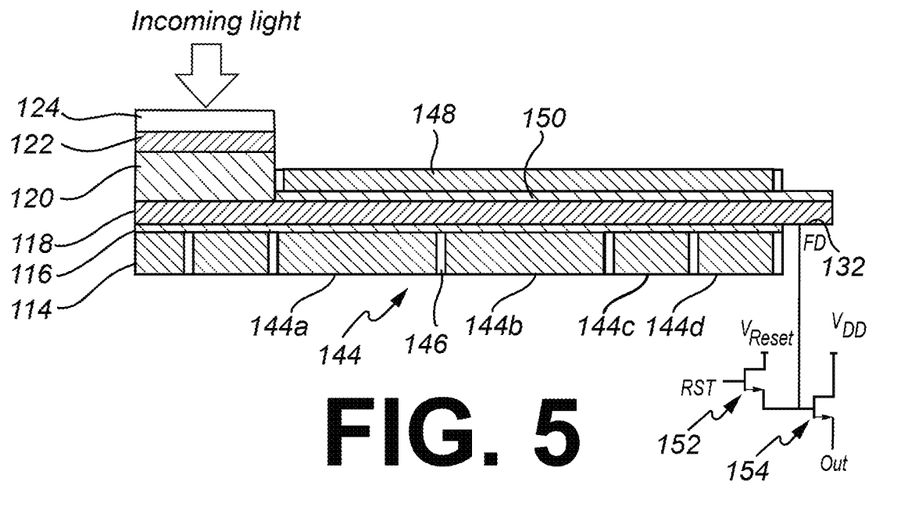
FIG. 5 is a schematic cross-sectional view along a column of the array for read-out of image information at an end of the column, according to example embodiments.

Referring now to FIGS. 4 and 5, read-out of image information from the array 102 of photo-sensitive elements 110 will be further described. FIGS. 4 and 5 illustrate two different embodiments of the image sensor 100 for providing read-out of image information.

FIGS. 4 and 5 each illustrate a cross-section along a part of a column 106 of the array 102, showing a photo-sensitive element 110 from which image information is read out, e.g. a last photo-sensitive element 110 at an end of the column 106.

The charges accumulated in the last photo-sensitive element 110 may be further transferred in the charge transport layer 118 extending beyond the end of the column 106. Thus, the charge transport layer 118 may comprise a transfer portion 130, wherein charges are transferred laterally from a portion of the charge transport layer 118 associated with the last photo-sensitive element 110 to a floating diffusion node 132.

As shown in FIG. 4, the image sensor 100 may comprise a plurality of gates 134, which may be provided as metal lines extending in parallel with the metal lines forming gates 114 of the photo-sensitive elements 110. Each of the gates 134 may be formed by a metal line of corresponding thickness to the metal lines forming gates 114 and adjacent gates 134 may be separated by a dielectric material 136. This may provide a structure which is readily manufactured as all gates 114, 134 may be formed by metal lines of identical thickness and equally spaced apart.

The image sensor 100 may further optionally comprise a front metal gate 138, which may be separated from the charge transport layer 118 by a dielectric material 140 and arranged above the charge transport layer 118, such that the charge transport layer 118 is sandwiched between the gates 134 and the front metal gate 138. The front metal gate 138 may have a thickness corresponding to a combined thickness of the gates 134. The front metal gate 138 may be used for controlling a potential of the charge transport layer 118 so as to push charges towards a back interface, i.e. towards a surface of the charge transport layer 118 facing the gates 134.

The gates 134 may be clocked in order to sequentially move the charges laterally along the charge transport layer 118 from a portion of the charge transport layer 118 associated with the last photo-sensitive element 110 towards the floating diffusion node 132.

As shown in FIG. 5, the image sensor 100 may comprise a plurality of gates 144, which may be provided as metal lines extending in parallel with the metal lines forming gates 114 of the photo-sensitive elements 110 and adjacent gates 144 may be separated by a dielectric material 146.

The plurality of gates 144 may comprise a first gate 144a closest to the last photo-sensitive element 110 which may be used for providing a back barrier to the last photo-sensitive element 110.

The plurality of gates 144 may further comprise a second gate 144b adjacent to the first gate 144a which may be used for providing an output summing well for receiving charges accumulated through the column 106 of the array 102.

The first and second gates 144a, 144b may have a larger thickness than the gates 114 so as to be adapted to handle large signal levels (corresponding to charges having been accumulated through the column 106) and to enhance charge transfer efficiency to the floating diffusion node 132.

The plurality of gates 144 may further comprise a third gate 144c and a fourth gate 144d adjacent to the second gate 144b, wherein the third and fourth gates 144c, 144d may be used as a first and second output transfer gate for transferring charges from the portion of the charge transport layer 118 associated with the second gate 144b to the floating diffusion node 132.

The image sensor 100 may further optionally comprise a front metal gate 148, which may be separated from the charge transport layer 118 by a dielectric material 150 and arranged above the charge transport layer 118, such that the charge transport layer 118 is sandwiched between the gates 144 and the front metal gate 148. The front metal gate 148 may have a thickness corresponding to a combined thickness of the gates 144. The front metal gate 148 may be used for controlling a potential of the charge transport layer 118 so as to push charges towards a back interface, i.e. towards a surface of the charge transport layer 118 facing the gates 144.

As further illustrated in FIGS. 4 and 5, the floating diffusion node 132 may be connected to read-out circuitry 108 for reading out a signal representing an amount of light detected in the column 106 of the array 102.

The circuitry 108 may further comprise a reset transistor 152 for resetting the floating diffusion node 132 before a signal is read out from the image sensor 100.

The floating diffusion node 132 may be connected to a gate of a source follower transistor 154. A signal representing an amount of light may be read out from the source follower transistor 152.

A signal from the source follower transistor 154 may be read out after reset by the reset transistor 152 and before a signal is provided to the floating diffusion node 132 corresponding to the amount of light. Thus, correlated double sampling may be performed to cancel thermal (kTC) noise.

Figure 6:
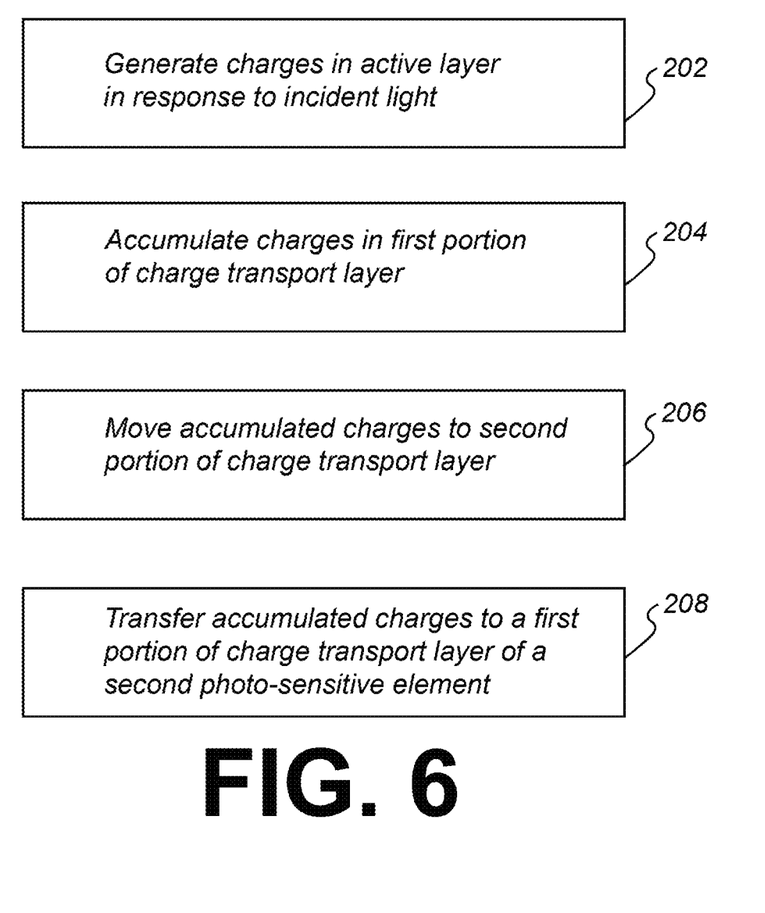
FIG. 6 is a flow chart of a method, according to example embodiments.

Referring now to FIG. 6, a method for imaging using an image sensor 100 will be described.

The method may comprise generating 202 charges in an active layer 120 in response to incident light on the active layer 120. The method may further comprise accumulating 204 charges, based on the generated charges, in a first portion 118a of a charge transport layer 118 of a first photo-sensitive element 110a.

The method may further comprise moving 206 accumulated charges from the first portion 118a of the charge transport layer 118 to a second portion 118c of the charge transport layer 118 of the first photo-sensitive element 110a. The movement of charges may be controlled by controlling voltages provided to at least a first and a second gate 114a, 114c, each separated by a dielectric material from the charge transport layer 118. The first and second gates 114a, 114c are configured to control a potential of respective portions 118a, 118c of the charge transport layer 118 in order to control movement of charges laterally in the charge transport layer 118.

The method may further comprise transferring 208 the accumulated charges from the second portion 118c of the charge transport layer 118 of the first photo-sensitive element 110a to a first portion 118a of the charge transport layer 118 of a second photo-sensitive element 110b adjacent to the first photo-sensitive element 110 in a direction along a column 106 of the array 102.

Hence, charges may be laterally transferred within the charge transport layer 118 for transferring the charges towards read-out circuitry 108 which may be shared for plural photo-sensitive elements 110 of a column 106 of the array.

The method may comprise that transfer of the accumulated charges is synchronized with movement of an object to be imaged in relation to the image sensor 100. The charges accumulated based on the generated charges in the second photo-sensitive element 110b may then be added to the accumulated charges transferred from the first photo-sensitive element 110a to the first portion 118a of the second photo-sensitive element 110b such that TDI imaging may be performed.

Features have mainly been described with reference to a limited number of example embodiments. However, as is readily appreciated, other examples than the ones disclosed above are equally possible within the scope of the disclosure, as defined by the appended claims.

For instance, in some examples, read-out of image information need not necessarily be performed only at ends of columns 106 in the array. Rather, it could be envisaged that read-out circuitry is associated with a plurality of dedicated read-out rows. Thus, rows 104 of the array 102 arranged between two read-out rows may define a subset of the array 102 and the image information read out at each read-out row may represent light detected in the subset of the array 102.

What is claimed is:

1. An image sensor for time delay and integration (TDI) imaging comprising:
   an array of photo-sensitive elements comprising a plurality of photo-sensitive elements arranged in rows and columns of the array, wherein each photo-sensitive element comprises:
      an active layer configured to generate charges in response to incident light on the active layer;
      a charge transport layer formed of a semiconductor, wherein the charge transport layer comprises a first portion and a second portion, and wherein the second portion is laterally displaced in a direction along a column of the array in relation to the first portion; and
      at least a first and a second gate, each separated by a dielectric material from the charge transport layer, wherein the charge transport layer is arranged between the active layer and the first and the second gate, wherein the first gate is configured to control a potential of the first portion of the charge transport layer and the second gate is configured to control a potential of the second portion of the charge transport layer, and wherein the first and the second gates are configured for controlling movement of charges from the first portion of the charge transport layer to the second portion of the charge transport layer,
   wherein the array of photo-sensitive elements is configured such that the second gate of a first photo-sensitive element and the first gate of a second photo-sensitive element adjacent to the first photo-sensitive element in a direction along a column of the array are configured to control transfer of charges from the second portion of the charge transport layer of the first photo-sensitive element to the first portion of the charge transport layer of the second photo-sensitive element.

2. The image sensor according to claim 1, wherein the first gate of the photo-sensitive elements is provided by a first metal line extending in a direction along a row of the array such that the first metal line is shared by photo-sensitive elements in the row of the array, and wherein the second gate of the photo-sensitive elements is provided by a second metal line extending in a direction along a row of the array such that the second metal line is shared by photo-sensitive elements in the row of the array.

3. The image sensor according to claim 2, wherein the first metal line and the second metal line are arranged in a back metal gate layer of the image sensor, and wherein the image sensor further comprises a spacer dielectric line extending in a direction along a row of the array between the first metal line and the second metal line.

4. The image sensor according to claim 1, wherein the charge transport layer comprises a plurality of charge transport stripes, and wherein each charge transport stripe is configured to extend in a direction along a column of the array.

5. The image sensor according to claim 4, wherein the image sensor further comprises a spacer dielectric stripe in the charge transport layer, and wherein the spacer dielectric stripe is configured to extend in a direction along a column of the array to separate two adjacent charge transport stripes.

6. The image sensor according to claim 1, wherein at least the first gate is configured to provide a voltage for fully depleting the first portion of the charge transport layer.

7. The image sensor according to claim 1, wherein the active layer comprises a quantum dot, an organic photodetector material, or a perovskite material.

8. The image sensor according to claim 1, wherein the charge transport layer is formed by a metal-oxide semiconductor, and wherein the metal-oxide semiconductor comprises indium-gallium-zinc oxide (IGZO), titanium oxide, or zinc oxide.

9. The image sensor according to claim 1, wherein each photo-sensitive element comprises a stack comprising, from bottom to top of the stack, a gate metal, a dielectric, the charge transport layer, and the active layer, and wherein light is incident on the photo-sensitive element from the top of the stack.

10. The image sensor according to claim 9, wherein the charge transport layer is an electron transport layer, and wherein the stack further comprises a hole transport layer on top of the active layer.

11. The image sensor according to claim 1, further comprising a floating diffusion node connected to the charge transport layer at an end of a column of the array.

12. The image sensor according to claim 11, wherein the charge transport layer is connected to a floating diffusion node of a read-out integrated circuit for read-out of image information from the array of photo-sensitive elements.

13. The image sensor according to claim 1, wherein the array of photo-sensitive elements is configured to accumulate charges generated in response to incident light at photo-sensitive elements in a column of the array and synchronize transfer of the accumulated charges along the column of the array with movement of an object to be imaged in relation to the image sensor for time delay and integration imaging.

14. A method for imaging using an array of photo-sensitive elements comprising a plurality of photo-sensitive elements arranged in rows and columns of the array, wherein the method comprises:
generating charges in an active layer in response to incident light on the active layer;
accumulating charges, based on the generated charges, in a first portion of a charge transport layer of a first photo-sensitive element;
moving accumulated charges from the first portion of the charge transport layer to a second portion of a charge transport layer of the first photo-sensitive element under control of a first and a second gate, each separated by a dielectric material from the charge transport layer, wherein the first gate is configured to control a potential of the first portion of the charge transport layer and the second gate is configured to control a potential of the second portion of the charge transport layer; and
transferring the accumulated charges from the second portion of the charge transport layer of the first photo-sensitive element to a first portion of the charge transport layer of a second photo-sensitive element adjacent to the first photo-sensitive element in a direction along a column of the array.

15. The method according to claim 14, further comprising synchronizing transfer of the accumulated charges with movement of an object to be imaged in relation to the array of photo-sensitive elements, wherein charges accumulated based on the generated charges in the second photo-sensitive element are added to the accumulated charges transferred from the first photo-sensitive element to the first portion of the second photo-sensitive element.

16. The method according to claim 14, wherein at least the first gate is configured to provide a voltage for fully depleting the first portion of the charge transport layer.

17. The method according to claim 14, wherein the active layer comprises a quantum dot, an organic photodetector material, or a perovskite material.

18. The method according to claim 14, wherein the charge transport layer is formed by a metal-oxide semiconductor, and wherein the metal-oxide semiconductor comprises indium-gallium-zinc oxide (IGZO), titanium oxide, or zinc oxide.

19. The method according to claim 14, wherein each photo-sensitive element comprises a stack comprising, from bottom to top of the stack, a gate metal, a dielectric, the charge transport layer, and the active layer, and wherein light is incident on the photo-sensitive element from the top of the stack.

20. The method according to claim 19, wherein the charge transport layer is an electron transport layer, and wherein the stack further comprises a hole transport layer on top of the active layer.

* * * * *